(12) United States Patent
Ando et al.

(10) Patent No.: US 11,910,113 B2
(45) Date of Patent: Feb. 20, 2024

(54) IMAGE SENSOR AND IMAGE-CAPTURING DEVICE HAVING PIXELS FOR FOCUS DETECTION AND PIXELS FOR IMAGE GENERATION

(71) Applicant: NIKON CORPORATION, Tokyo (JP)

(72) Inventors: Ryoji Ando, Sagamihara (JP); Toru Takagi, Fujisawa (JP); Shutaro Kato, Kawasaki (JP); Yoshiyuki Watanabe, Kawasaki (JP); Takashi Seo, Yokohama (JP)

(73) Assignee: NIKON CORPORATION, Tokyo (JP)

( * ) Notice: Subject to any disclaimer, the term of this patent is extended or adjusted under 35 U.S.C. 154(b) by 660 days.

(21) Appl. No.: 17/056,064

(22) PCT Filed: May 22, 2019

(86) PCT No.: PCT/JP2019/020350
§ 371 (c)(1),
(2) Date: Jun. 17, 2021

(87) PCT Pub. No.: WO2019/225668
PCT Pub. Date: Nov. 28, 2019

(65) Prior Publication Data
US 2021/0314512 A1 Oct. 7, 2021

(30) Foreign Application Priority Data
May 23, 2018 (JP) .................................. 2018-099061

(51) Int. Cl.
*H04N 25/75* (2023.01)
*H01L 27/146* (2006.01)
(Continued)

(52) U.S. Cl.
CPC ....... *H04N 25/75* (2023.01); *H01L 27/14612* (2013.01); *H01L 27/14623* (2013.01); *H04N 25/766* (2023.01); *H04N 25/772* (2023.01)

(58) Field of Classification Search
CPC .... H04N 25/75; H04N 25/766; H04N 25/772; H04N 25/77; H04N 25/704; H04N 25/46; H01L 27/14612; H01L 27/14623
See application file for complete search history.

(56) References Cited

U.S. PATENT DOCUMENTS 8,310,590 B2 * 11/2012 Kusaka ................ H04N 25/704
396/326
10,469,779 B2 * 11/2019 Matsunaga ............ H04N 25/62
(Continued)

FOREIGN PATENT DOCUMENTS

JP 2008-085535 A 4/2008
JP 2011-234025 * 11/2011
(Continued)

OTHER PUBLICATIONS

Aug. 6, 2019 International Search Report issued in International Patent Application No. PCT/JP2019/020350.
(Continued)

*Primary Examiner* — Luong T Nguyen
(74) *Attorney, Agent, or Firm* — Oliff PLC

(57) ABSTRACT

An image sensor includes: a first photoelectric conversion unit that photoelectrically converts light to generate an electric charge; a first output unit that outputs a first signal based on the electric charge generated by the first photoelectric conversion unit; a plurality of second photoelectric conversion units that photoelectrically convert light to generate electric charges; a plurality of second output units that output second signals based on the electric charges generated by the second photoelectric conversion units; an output line to which the first output unit and the plurality of second
(Continued)

output units are connected, and from which at least one of the first signal and the second signals is output; a first control line for controlling the output of the first signal from the first output unit; and second control lines for controlling the outputs of the second signals from the plurality of second output units.

19 Claims, 6 Drawing Sheets

(51) Int. Cl.
*H04N 25/766* (2023.01)
*H04N 25/772* (2023.01)

(56) References Cited

U.S. PATENT DOCUMENTS

| | | | | |
|---|---|---|---|---|
| 2007/0237511 | A1* | 10/2007 | Kusaka | G03B 13/00 396/111 |
| 2008/0074534 | A1 | 3/2008 | Kusaka | |
| 2011/0013061 | A1* | 1/2011 | Hoda | H04N 25/702 348/E5.045 |
| 2013/0182165 | A1 | 7/2013 | Kimura | |
| 2015/0229847 | A1* | 8/2015 | Aoki | G02B 7/34 348/333.05 |

FOREIGN PATENT DOCUMENTS

| | | |
|---|---|---|
| JP | 2011-234025 A | 11/2011 |
| JP | 2013-143730 A | 7/2013 |
| JP | 2015-186171 A | 10/2015 |
| JP | 2015-204382 A | 11/2015 |

OTHER PUBLICATIONS

Aug. 6, 2019 Written Opinion issued in International Patent Application No. PCT/JP2019/020350.
Dec. 5, 2022 Office Action issued in Chinese Patent Application No. 201980044048.3.
Nov. 2, 2021 Office Action issued in Japanese Patent Application No. 2020-520346.
Mar. 14, 2023 Office Action issued in Japanese Patent Application No. 2022-043916.

\* cited by examiner

IMAGE SENSOR AND IMAGE-CAPTURING DEVICE HAVING PIXELS FOR FOCUS DETECTION AND PIXELS FOR IMAGE GENERATION

TECHNICAL FIELD

The present invention relates to an image sensor and an image-capturing device.

BACKGROUND ART

Conventionally, an image sensor that adds and reads out signals of a plurality of pixels is known (for example, PTL1). However, the conventional image sensor cannot obtain a signal obtained by adding signals of a given number of pixels.

CITATION LIST

Patent Literature

PTL1: Japanese Laid-Open Patent Publication No. 2013-143730

SUMMARY OF INVENTION

An image sensor according to the 1st aspect comprises: a first photoelectric conversion unit that photoelectrically converts light to generate an electric charge; a first output unit that outputs a first signal based on the electric charge generated by the first photoelectric conversion unit; a plurality of second photoelectric conversion units that photoelectrically convert light to generate electric charges; a plurality of second output units that output second signals based on the electric charges generated by the second photoelectric conversion units; an output line to which the first output unit and the plurality of second output units are connected, and to which at least one of the first signal and the second signals is output; a first control line for controlling output of the first signal from the first output unit to the output line; and second control lines for controlling outputs of the second signals from the plurality of second output units to the output line.

An image-capturing device according to the 2nd aspect comprises: the image sensor according to the 1st aspect; and a generation unit that generates image data based on the second signal.

BRIEF DESCRIPTION OF DRAWINGS

FIG. 2 is a plan view of the image sensor as viewed from an image-capturing surface side.

DESCRIPTION OF EMBODIMENTS

Embodiment of Image-Capturing Device

Figure 1:
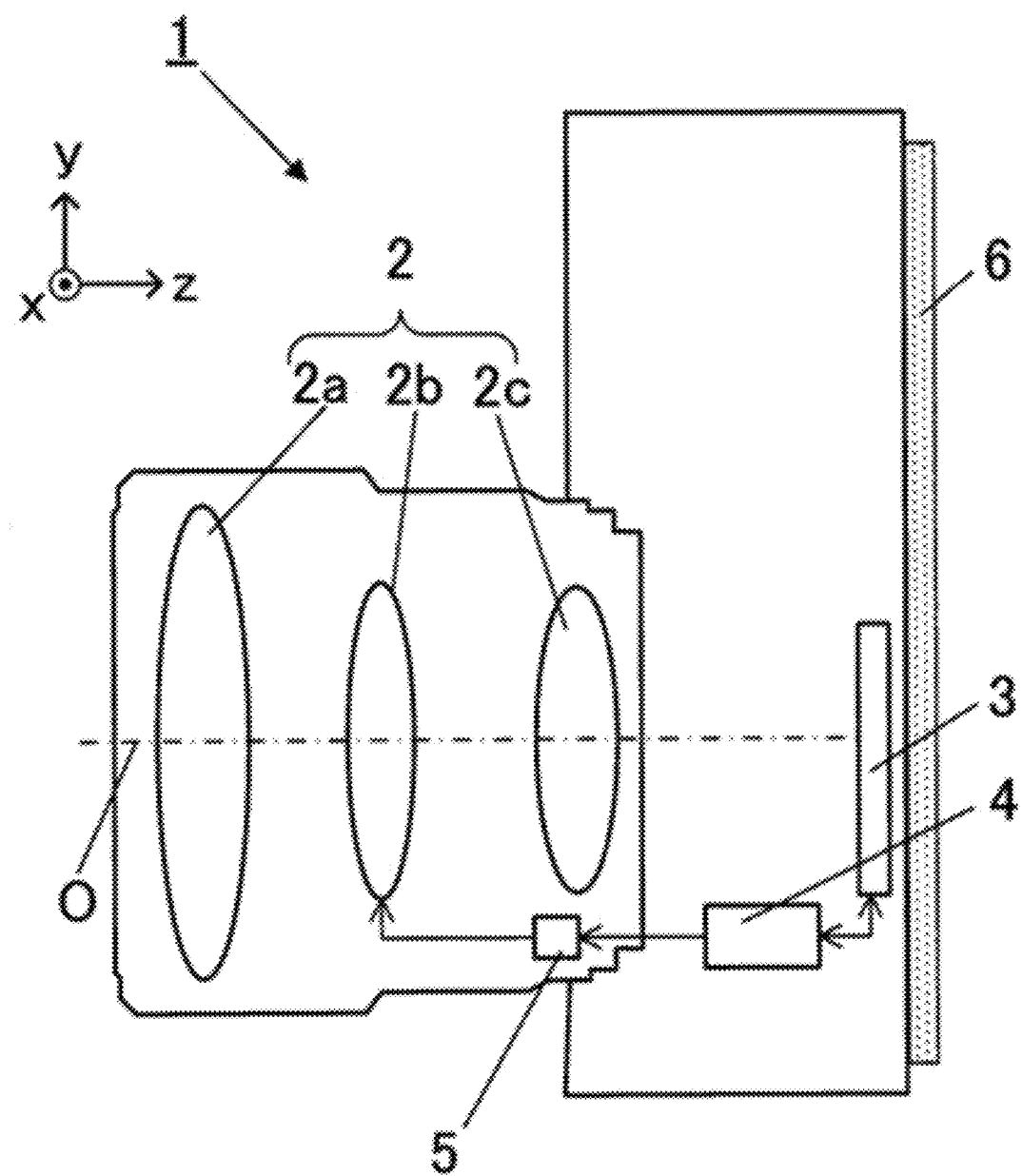
FIG. 1 is a cross-sectional view schematically showing a configuration of an image-capturing device.

FIG. 1 is a cross-sectional view schematically showing a configuration of an image-capturing device with an image sensor according to a first embodiment. The image-capturing device 1 includes an image-capturing optical system 2, an image sensor 3, a control unit 4, a lens drive unit 5, and a display unit 6.

The image-capturing optical system 2 forms a subject image on an image-capturing surface of the image sensor 3. The image-capturing optical system 2 includes a lens 2a, a focusing lens 2b, and a lens 2c. The focusing lens 2b is a lens for performing focus adjustment of the image-capturing optical system 2. The focusing lens 2b is configured to be movable in an optical axis Z direction.

The lens drive unit 5 has an actuator (not shown). The lens moving unit 5 uses the actuator to move the focusing lens 2b in the optical axis Z direction. The image sensor 3 captures a subject image and outputs a signal. The image sensor 3 has image-capturing pixels and AF pixels (focus detection pixels). The image-capturing pixel outputs a signal (image signal) used for image generation. The AF pixel outputs a signal (focus detection signal) used for focus detection. The control unit 4 controls units such as the image sensor 3. The control unit 4 performs image processing or the like on the image signal output by the image sensor 3 to generate image data. The control unit 4 records the image data on a recording medium (not shown) or displays an image based on the image data on the display unit 6, for example. The control unit 4 can also be regarded as a generation unit that generates an image based on an image signal. The display unit 6 is a display device having a display member such as a liquid crystal panel.

Further, the control unit 4 performs a focus detection processing necessary for automatic focus adjustment (AF) of the image-capturing optical system 2 in a known phase difference detection scheme. Specifically, the control unit 4 detects a focus position of the focusing lens 2b for forming an image from the image-capturing optical system 2 on the image-capturing surface of the image sensor 3. The control unit 4 detects an image deviation amount between a first image and a second image based on a pair of focus detection signals output from the image sensor 3. Based on the detected image deviation amount, the control unit 4 calculates a deviation amount (defocus amount) between a current position and the focus position of the focusing lens 2b. The focus adjustment is automatically performed by driving the focusing lens 2b based on the defocus amount.

Embodiment of Image Sensor

Figure 2A:
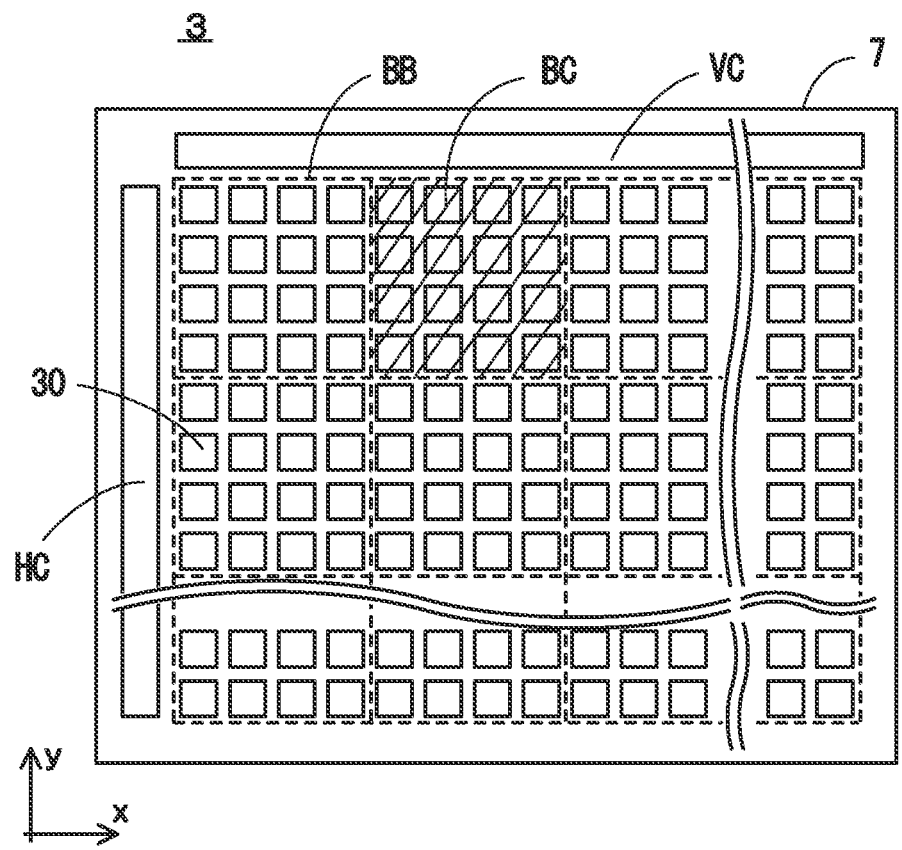
FIG. 2(a) is an overall view of the image sensor and FIG. 2(b) is an enlarged view of a part thereof.

FIG. 2(a) is a view of the image sensor 3 according to the embodiment of the present invention as viewed from the image-capturing surface side, that is, from the −Z side of FIG. 1. The image sensor 3 has a plurality of pixels 30 arranged in the x direction and the y direction of FIG. 2. A large number of pixels 30, for example, 1000 or more pixels 30 may be arranged in the x direction and the y direction, respectively, although a part of the pixels is omitted in FIG. 2.

A horizontal control unit HC is provided at the left end of a region (image-capturing region) in which the plurality of pixels 30 are arranged, and a vertical control unit VC is provided at the upper end of the region in the figure.

The image sensor 3 has a plurality of pixel blocks BC. In FIG. 2, one pixel block BC has a plurality of pixels 30 arranged in the x direction and the y direction, which are surrounded by a boundary line BB indicated by a broken line. Output units of the plurality of pixels 30 in each pixel block BC are connected to one output line and one readout unit as described later. Note that the plurality of pixels 30 in each pixel block BC may be connected to a plurality of output lines and a plurality of readout units.

In FIG. 2, a portion corresponding to one pixel block BC is hatched for ease of explanation. However, each region surrounded by each boundary line BB indicated by a broken line constitutes a pixel block BC. The plurality of pixels 30 are divided into the plurality of pixel blocks BC and arranged therein.

In the case of the example shown in FIG. 2, a total of sixteen pixels 30, which are arranged in a 4×4 matrix in the x and y directions, constitute one pixel block BC.

The number of pixels arranged in the x direction and in the y direction in one pixel block BC is not limited to four, but may be another number such as 6 or 8. The numbers of arranged pixels in the x direction and in the y direction may be different from each other.

Further, a contour of the pixel block BC is not limited to a rectangle as shown in FIG. 2, but may be any shape enclosing a plurality of pixels 30. In this case, the boundary line BB is not constituted by a simple straight line, but constituted by a plurality of straight lines that are bent and connected.

Figure 2B:
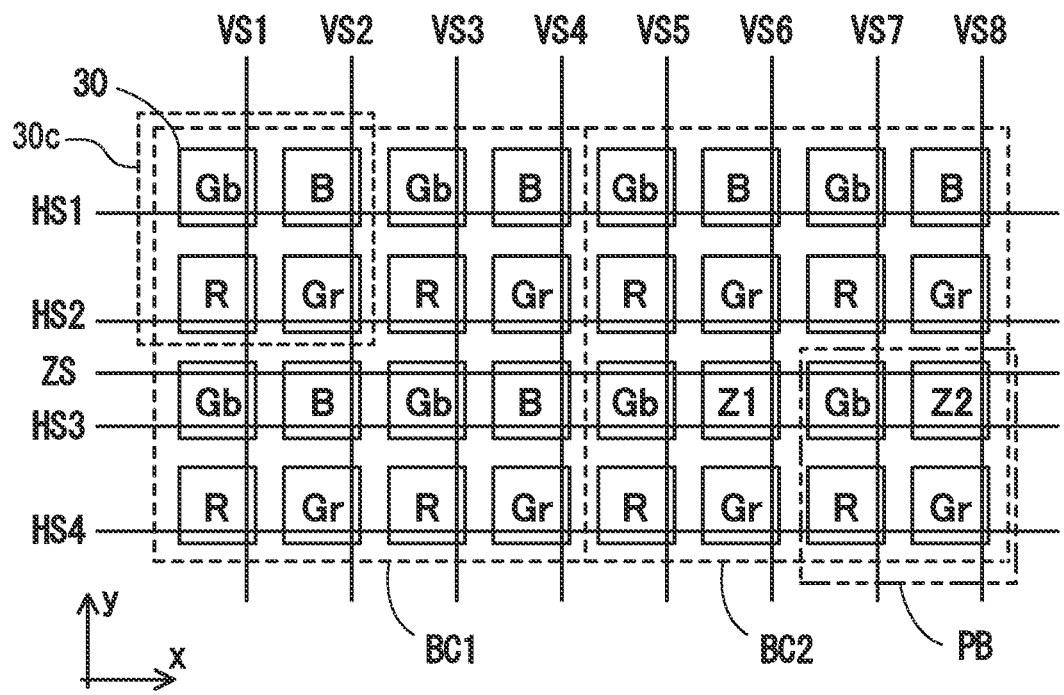

FIG. 2(b) is an enlarged view of two pixel blocks BC1 and BC2 adjacent to each other in the x direction, among the pixel blocks BC shown in FIG. 2(a).

As shown in FIG. 2(b), each of the plurality of pixels 30 is provided with one of three color filters having different spectral characteristics of R (red), G (green), and B (blue), for example. The R color filter mainly transmits light in the red wavelength region, the G color filter mainly transmits light in the green wavelength region, and the B color filter mainly transmits light in the blue wavelength region. The pixels have different spectral characteristics depending on the color filters arranged therein. The pixels 30 include pixels having a sensitivity to red (R) light (hereinafter referred to as R pixels R), pixels having a sensitivity to green (G) light (hereinafter referred to as G pixels G), and pixels having a sensitivity to blue (B) light (hereinafter referred to as B pixels B). These pixels 30 are arranged in a so-called Bayer array. A G pixel Gb is a G pixel arranged in the same x direction as that of the B pixel B, and a G pixel Gr is a G pixel arranged in the same x direction as that of the R pixel R.

The pixel block BC1 has four G pixels Gb, four G pixels Gr, four R pixels R, and four B pixels B arranged in a Bayer array. These pixels 30 are image-capturing pixels Gb, Gr, R, B (hereinafter collectively also referred to as image-capturing pixels 30c) used for capturing an optical image formed on the image-capturing surface of the image sensor 3.

The arrangement of the pixels 30 in the pixel block BC2 is almost the same as that in the pixel block BC1. However, some pixels in positions at which the B pixels B are arranged in the pixel block BC1 are replaced by special pixels Z1 and Z2 (collectively also referred to as special pixels ZZ), which are different from the above-described image-capturing pixels 30c.

The special pixels ZZ are AF pixels, for example, and their configuration will be described later.

The special pixels ZZ are not limited to the AF pixels, but may be pixels having a sensitivity different from that of any of the above-described image-capturing pixels 30c. Further, the special pixels ZZ may have a color filter having spectral characteristics different from those of any of the above-described image-capturing pixels 30c.

The special pixels ZZ can also be regarded as first pixels. On the other hand, the image-capturing pixels 30c can also be regarded as a second pixels.

The pixel block BC2 includes at least one special pixel ZZ and a plurality of image-capturing pixels 30c, among a plurality of pixels 30.

At least one pixel block BC among the plurality of pixel blocks BC, such as the pixel block BC2, is composed of at least one special pixel ZZ and a plurality of image-capturing pixels 30c. At least one pixel block BC among the plurality of pixel blocks BC, such as the pixel block BC1, may be composed of image-capturing pixels 30c alone.

From the vertical control unit VC shown in FIG. 2(a), vertical selection lines VS1 to VS8 (collectively also referred to as vertical selection lines VS) connected to a selection unit TV (described later) of each pixel 30 extend in the y direction. From the horizontal control unit HC, horizontal selection lines HS1 to HS4 (collectively also referred to as horizontal selection lines HS) connected to a selection unit TH2 (described later) of each image-capturing pixel 30c extend in the x direction. From the horizontal control unit HC, a special horizontal selection line ZS connected to a selection unit (described later) for each of the special pixels Z1 and Z2 extends in the x direction.

As shown in FIG. 2(b), each of the vertical selection lines VS1 to VS8 is shared by a plurality of pixels 30 arranged in the y direction, and each of the horizontal selection lines HS1 to HS4 is shared by a plurality of image-capturing pixels 30c arranged in the x direction. The special horizontal selection line ZS is shared by a plurality of special pixels ZZ arranged in the x direction.

Figure 3:
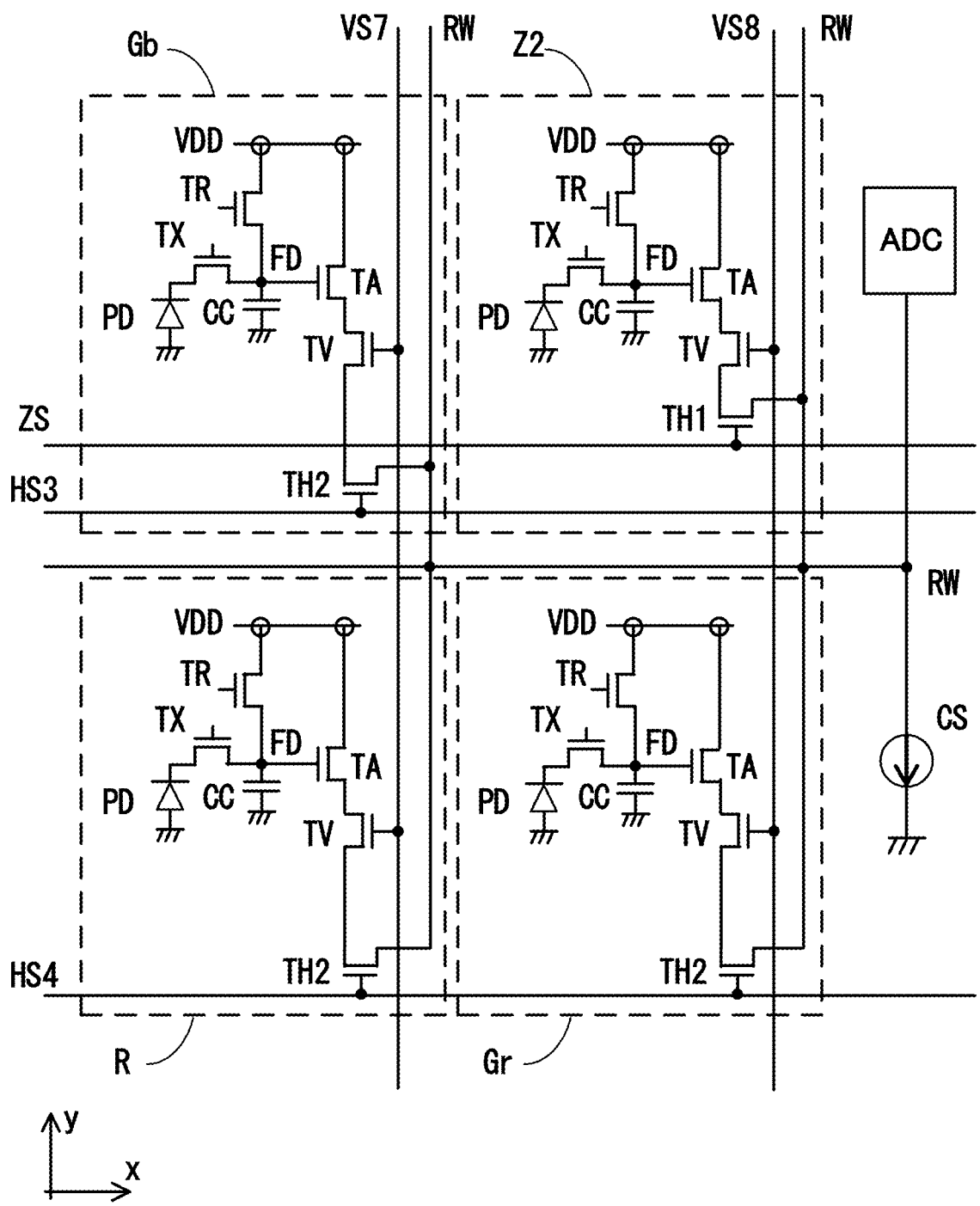
FIG. 3 is a circuit diagram of pixels of an image sensor and a readout circuit.

FIG. 3 is an enlarged view showing an outline of an electric circuit of four pixels 30 (two in the vertical direction and two in the horizontal direction) enclosed by a chain double-dashed line PB in the lower right in the pixel block BC2 shown in FIG. 2(b). As shown in the chain double-dashed line PB in FIG. 2(b), the four pixels 30 are a G pixel Gb in the upper left, a special pixel Z2 in the upper right, a R pixel R in the lower left, and a G pixel Gr in the lower right.

The four pixels (Gb, Z2, R, Gr) are basically so-called 4-transistor type CMOS image sensors. However, as will be described later, a configuration of a so-called selection transistor is different from that in a normal 4-transistor type CMOS image sensor.

In each pixel (Gb, Z2, R, Gr), a photodiode PD, which is a photoelectric conversion unit, photoelectrically converts incident light to generate an electric charge, and temporarily accumulates the generated electric charge. A transfer transistor TX transfers the electric charge accumulated in the photodiode PD to a floating diffusion (FD) region FD in which a capacitance CC is formed, based on a transfer signal transmitted from a transfer control line (not shown) to a gate of the transfer transistor TX. A voltage generated in the FD region FD by the transferred electric charge is applied to a gate of the amplification transistor TA, and the amplification transistor TA then outputs a signal corresponding to the electric charge generated by the photodiode PD.

A power supply voltage VDD is applied to an input side (drain) of the amplification transistor TA. A reset transistor TR resets the voltage of the FD region FD to the power supply voltage VDD by discharging the electric charge of the FD region FD to the power supply voltage VDD side.

An output side (source side) of the amplification transistor TA of each pixel (Gb, Z2, R, Gr) is connected to an input side of the vertical selection transistor TV. A gate of the vertical selection transistor TV is connected to the vertical selection line VS7 or VS8, and the vertical selection transistor TV is brought into conduction or out of conduction by a control signal transmitted from the vertical control unit VC shown in FIG. 2(a).

An output side of the vertical selection transistor TV of the image-capturing pixel (Gb, R, Gr) is connected to an input side of the horizontal selection transistor TH2. A gate of the horizontal selection transistor TH2 is connected to the horizontal selection line HS3 or HS4, and the horizontal selection transistor TH2 is brought into conduction or out of conduction by a control signal transmitted from the horizontal control unit HC shown in FIG. 2(a).

In the image-capturing pixels (Gb, R, Gr) of the image sensor 3 in the embodiment, one or both of the horizontal selection transistor TH2 and the vertical transistor TV can be regarded as an output unit (a second output unit, as an output unit of the second pixel) of the image-capturing pixel (Gb, R, Gr).

Alternatively, the amplification transistor TA can be regarded as an output unit (second output unit). The second output unit may include the amplification transistor TA, and one or both of the horizontal selection transistor TH2 and the vertical transistor TV. On the other hand, an output side of a vertical selection transistor TV of the special pixel Z2 is connected to an input side of a special horizontal selection transistor TH1. A gate of the special horizontal selection transistor TH1 is connected to the special horizontal selection line ZS, and the special horizontal selection transistor TH1 is brought into conduction or out of conduction by a control signal transmitted from the horizontal control unit HC shown in FIG. 2(a).

In the special pixel Z2 of the image sensor 3 of the embodiment, one or both of the special horizontal selection transistor TH1 and the vertical transistor TV can be regarded as an output unit (a first output unit, as an output unit of the first pixel). Alternatively, the amplification transistor TA can be regarded as an output unit (first output unit). The second output unit may include the amplification transistor TA, and one or both of the horizontal selection transistor TH1 and the vertical transistor TV.

Since the special horizontal selection line ZS controls the first output unit (selection transistor TH1) which is the output unit of the first pixel (special pixel ZZ), it can be regarded as a first control line.

Further, since the horizontal selection line HS controls the second output unit (selection transistor TH2) which is the output unit of the second pixel (image-capturing pixel 30c), it can be regarded as a second control line.

Furthermore, the vertical selection line VS can also be interpreted as a third control line.

The output unit of the horizontal selection transistor TH2 of the image-capturing pixels (Gb, R, Gr) in the pixel block BC2 and the output unit of the special horizontal selection transistor TH1 in the special pixel Z2 in the pixel block BC2 are connected to one output line RW. The output line RW is connected to a readout unit that reads out a signal of the pixel 30. The readout unit has, for example, an AD conversion unit that converts an analog signal output from the pixel 30 into a digital signal. Further, the output line RW is connected to a current source CS that supplies electric current to the amplification transistors TA or the like in the pixel 30.

As described above, the vertical control unit VC and the horizontal control unit HC control the voltages of the control signals to the vertical selection line VS and the horizontal selection line HS, thereby outputting signals (outputs of the amplification transistor TA) of any one or more pixels (Gb, Z2, R, Gr) in the pixel block BC2 to the output line RW. The readout unit reads out the signals of the pixels (Gb, Z2, R, Gr) in the pixel block BC2.

An image-capturing operation including an operation of resetting the pixels 30 of the image sensor 3 of the present embodiment is almost the same as that of a conventional 4-transistor type CMOS image sensor. In other words, prior to an exposure operation for image capture or focus detection, the reset transistor TR and the transfer transistor TX are brought into conduction with the power supply voltage VDD, and the FD region FD and the photodiode PD are reset to the power supply voltage VDD. Thereafter, the transfer transistor TX is brought out of conduction, and an exposure for image capture or focus detection is performed in the photodiode PD.

The readout unit of the image sensor 3 of the present embodiment can read out an added signal obtained by adding (summing, binning) signals of a given number of pixels in one pixel block BC.

For example, when displaying a through image (live view image) on the display unit 6 or taking a video, the control unit 4 generates image data based on an added signal obtained by adding signals of a plurality of pixels 30. Image data based on the added signal becomes image data having a pixel number smaller than a total pixel number of the image sensor. Further, since noises mixed in the signals of the plurality of pixels 30 are smoothed by adding the signals of the pixels 30, the control unit 4 can generate an image with less noise. In order to add signals of a given number of pixels 30 in the pixel block BC, the vertical control unit VC and the horizontal control unit HC simultaneously output the signals of the given number of pixels 30 to the output line RW. The readout unit reads out the signals of the given number of pixels 30 in the pixel block BC, which are simultaneously output to the output line RW, as an added signal. Note that it is not necessary for a given number of pixels 30 to simultaneously output signals to the output line RW. Each pixel 30 among the given number of pixels 30 may output its signal while other pixels output their signals to the output line RW.

Note that in the image sensor 3 of the present embodiment, the signals of the plurality of pixels 30 are added by so-called source-follower-addition. Therefore, a value of a signal read out by the readout unit is not a sum of the signal values of the pixels 30, but is close to an average value of the signal values of the pixels 30.

The plurality of pixels 30 that output the added signal are preferably pixels having the same color. The vertical control unit VC and the horizontal control unit HC control the voltages of the control signals to the vertical selection line VS and the horizontal selection line HS to select a plurality of pixels 30 having the same color in one pixel block BC, and output their signals to the output line RW via the vertical selection transistors TV and the horizontal selection transistors TH. The readout unit reads out the signals of the selected pixels 30 having the same color, which are output to the output line RW, as an added signal.

Referring to FIG. 2(b), control by the vertical control unit VC and the horizontal control unit HC, and readout of signals by the readout unit will be described.

For example, in a case where signals of all R pixels R in the pixel block BC2 shown in FIG. 2(b) are added and output, the vertical control unit VC transmits signals for bringing the vertical selection transistor TV into conduction to the vertical selection lines VS5 and VS7 which are connected to the R pixels. The vertical control unit VC supplies a power supply voltage, for example. On the other hand, the vertical control unit VC transmits signals for bringing the vertical selection transistor TV out of conduction to the vertical selection lines VS6 and VS8 which are not connected to the R pixels. The vertical control unit VC supplies a ground voltage, for example.

Then, the horizontal control unit HC transmits a signal for bringing the horizontal selection transistor TH2 into conduction to the horizontal selection lines HS2 and HS4 connected to the R pixels, and a signal for bringing the horizontal selection transistor TH2 out of conduction to the horizontal selection lines HS1 and HS3 not connected to the R pixels.

Under the control of the vertical control unit VC and the horizontal control unit HC described above, the vertical selection transistor TV and the horizontal selection transistor TH2 are both brought into conduction in four R pixels R arranged at positions where the vertical selection lines VS5 and VS7 and the horizontal selection lines HS2 and HS4 intersect. Therefore, signals of the four R pixels R are simultaneously output to the output line RW. By the simultaneous output to the output line RW, the signals of the four R pixels R are added. The readout unit reads out the signals of four R pixels R, which are output to the output line RW, as an added signal.

Note that the horizontal control unit HC transmits a signal for bringing the horizontal selection transistor TH2 into conduction only to the horizontal selection line HS2, and transmits a signal for bringing the horizontal selection transistor TH2 out of conduction to the horizontal selection lines HS other than the horizontal selection line HS2, so that signals of two R pixels R arranged at positions where the horizontal selection line HS2 and the vertical selection lines VS5 and VS7 intersect can be simultaneously output to the output line RW. By the simultaneous output to the output line RW, the signals of the above-described two R pixels R are added. As a result, the readout unit can read out an added signal of the above-described two R pixels R.

Alternatively, the vertical control unit VC transmits a signal for bringing the vertical selection transistor TV into conduction only to the vertical selection line VS5, so that signals of two R pixels R arranged at positions where the vertical selection line VS5 and the horizontal selection lines HS2 and HS4 intersect can be simultaneously output to the output line RW. By the simultaneous output to the output line RW, the signals of the above-described two R pixels R are added. As a result, the readout unit can read out an added signal of the above-described two R pixels R.

Further, the vertical control unit VC and the horizontal control unit HC can output a signal of only one R pixel R in one pixel block BC2 to the output line RW. As a result, the readout unit can read out the signal of only one R pixel R. In this case, the vertical control unit VC may transmit a signal for bringing the vertical selection transistor TV into conduction to the vertical selection line VS5 or VS7 and a signal for bringing the horizontal selection transistor TH2 into conduction to the two horizontal lines HS2 or HS4.

In the pixel block BC2, two of the four B pixels B are replaced by the special pixels Z1 and Z2, but the readout of signals of the B pixels B is almost the same as the readout of the signals of the R pixels R described above.

In a case where signals of all B pixels B in the pixel block BC2 are added and output, the horizontal control unit HC transmits a signal for bringing the horizontal selection transistor TH2 into conduction to the horizontal selection line HS1. Further, the horizontal control unit HC transmits a signal for bringing the horizontal selection transistor TH2 out of conduction to the horizontal selection lines HS other than the horizontal selection line HS1 and a signal for bringing the special horizontal selection transistor TH1 out of conduction to the special horizontal selection line ZS.

Then, the vertical control unit VC transmits a signal for bringing the vertical selection transistor TV into conduction to the vertical selection lines VS6 and VS8, so that signals of two B pixels B are simultaneously output to the output line RW. By the simultaneous output to the output line RW, the signals of the two B pixels B are added. The readout unit reads out the added signal of the two B pixels B. Further, the vertical control unit VC transmits a signal for bringing the vertical selection transistor TV into conduction to the vertical selection line VS6 or VS8, so that the readout unit can read out a signal of one B pixel B.

The horizontal control unit HC transmits a signal for bringing the special horizontal selection transistor TH1 out of conduction to the special horizontal selection line ZS, so that signals of the special pixels Z1 and Z2 are not output to the output line RW. Therefore, the signals of the special pixels Z1 and Z2 are not mixed into the signals of the B pixels B.

Note that the horizontal selection line HS3 arranged in parallel with the special horizontal selection line ZS is not connected to the special horizontal selection transistor TH1 in the special pixels Z1 and Z2. Therefore, no matter what kind of signal the horizontal control unit HC transmits to the horizontal selection line HS3, the signals of the special pixels Z1 and Z2 are not mixed into the signals of the B pixels B.

However, since the horizontal selection line HS3 is shared with other pixel blocks BC such as the pixel block BC1 which are adjacent to the pixel block BC2 in the x direction, the signal transmitted by the horizontal control unit HC to the horizontal selection line HS3 is preferably a signal suitable for readout in the other pixel blocks BC.

The readout of signals of the G pixels G (the G pixels Gb and the G pixels Gr) in the pixel block BC2 is the same as the readout of the signals of the R pixels R and the B pixels B described above. The vertical control unit VC and the horizontal control unit HC transmit signals for controlling the vertical selection transistor TV and the horizontal selection transistor TH2 to selection lines connected to the G pixels G to be read out, among the vertical selection line VS and the horizontal selection line HS. As a result, the readout unit can read out a signal of one G pixel G or an added signal of a plurality of G pixels G.

At this time, the horizontal control unit HC transmits a signal for bringing the special horizontal selection transistor TH1 out of conduction to the special horizontal selection line ZS so that the signals of the special pixels Z1 and Z2 are not mixed into the signals of the G pixels G output to the output line RW.

When reading out a signal of the special pixel Z1, the vertical control unit VC and the horizontal control unit HC transmit signals for bringing the vertical selection transistor TV and the special horizontal selection transistor TH1 into conduction, respectively, to the vertical selection line VS6 and the special horizontal selection line ZS connected to the special pixel Z1, to output the signal of the special pixel Z1 to the output line RW. Further, when reading out the signal of the special pixel Z2, the vertical control unit VC and the horizontal control unit HC transmit signals for bringing the vertical selection transistor TV and the special horizontal selection transistor TH1 into conduction, respectively, to the vertical selection line VS8 and the special horizontal selection line ZS connected to the special pixel Z2, to output the signal of the special pixel Z2 to the output line RW. The readout unit reads out a signal of the special pixel Z1 or Z2 output to the output line RW. When reading out the signal of the special pixel Z1 or Z2, the vertical control unit VC and the horizontal control unit HC transmit signals for bringing the vertical selection transistor TV and the horizontal selection transistor TH2 out of conduction, respectively, to the vertical selection lines VS other than the vertical selection line VS6 and the vertical selection line VS8, and the horizontal selection line HS.

When the signals of the special pixels Z1 and Z2 are added and read out, the vertical control unit VC and the horizontal control unit HC transmit signals for bringing the vertical selection transistor TV and the special horizontal selection transistor TH1 into conduction, respectively, to the vertical selection line VS6 and the vertical selection line VS8, and the special horizontal selection line ZS, to simultaneously output the signals of the special pixels Z1 and Z2 to the output line RW. By the simultaneous output to the output line RW, the signals of the special pixels Z1 and Z2 are added. As a result, the readout unit reads out the added signal of the special pixels Z1 and Z2.

Although the readout of the signals of the pixels 30 in the pixel block BC2 has been described above, the same applies to other pixel blocks BC. The signal of each pixel in each pixel block BC is output to a respective output line RW provided in each pixel block BC, and is read out by the readout unit. Note that the vertical selection line VS, the horizontal selection line HS, and the special horizontal selection line ZS may be shared by a plurality of pixel blocks BC. For example, the horizontal selection lines HS1 to HS4 may be connected to pixels 30 in other pixel blocks BC, such as the pixel block BC1, aligned with the pixel block BC2 in the x direction. Further, the vertical selection lines VS5 to VS8 may be connected to each pixel 30 in other pixel blocks BC aligned with the pixel block BC2 in the y direction.

The signal read out by the readout unit of each pixel block BC is output from the image sensor 3 via an output circuit (not shown).

Note that the order of reading out the signals of the special pixels ZZ and the signals of the image-capturing pixels 30c may vary. For example, the vertical control unit VC and the horizontal control unit HC first select the special pixels Z1 and Z2 in this order via the vertical selection line VS and the horizontal selection line HS, and the readout unit reads out signals of the special pixels Z1 and Z2. Then, the vertical control unit VC and the horizontal control unit HC select image-capturing pixels 30c via the vertical selection line VS and the horizontal selection line HS, and the readout unit reads out signals of the image-capturing pixels 30c.

Since the number of the special pixels ZZ in the pixel block BC2 (here, two: Z1 and Z2) is smaller than the number of the image-capturing pixels 30c (here, a total of fourteen of Gb, Gr, R, and B), the time required to read out the signals of the special pixels ZZ is shorter than the time required to read out the signals of the image-capturing pixels. In other words, the readout of the signals of the special pixels ZZ can be performed at a higher speed than that of the readout of the signals of the image-capturing pixels 30c. For example, in a case where the special pixels ZZ are AF pixels, the readout of the signals of the special pixels ZZ is prior to the readout of the signals of the image-capturing pixels 30c, so that the control unit 4 can perform focus detection at a high speed.

Alternatively, two readout units may be provided in one pixel block BC. By connecting two readout units to the output line RW, the two readout units may read out the signals of the special pixels ZZ and the signals of the image-capturing pixels 30c, respectively. As a result, the readout unit can read out the signals of the special pixels ZZ and the signals of the image-capturing pixels 30c under readout conditions such as an optimal gain.

Figure 4:
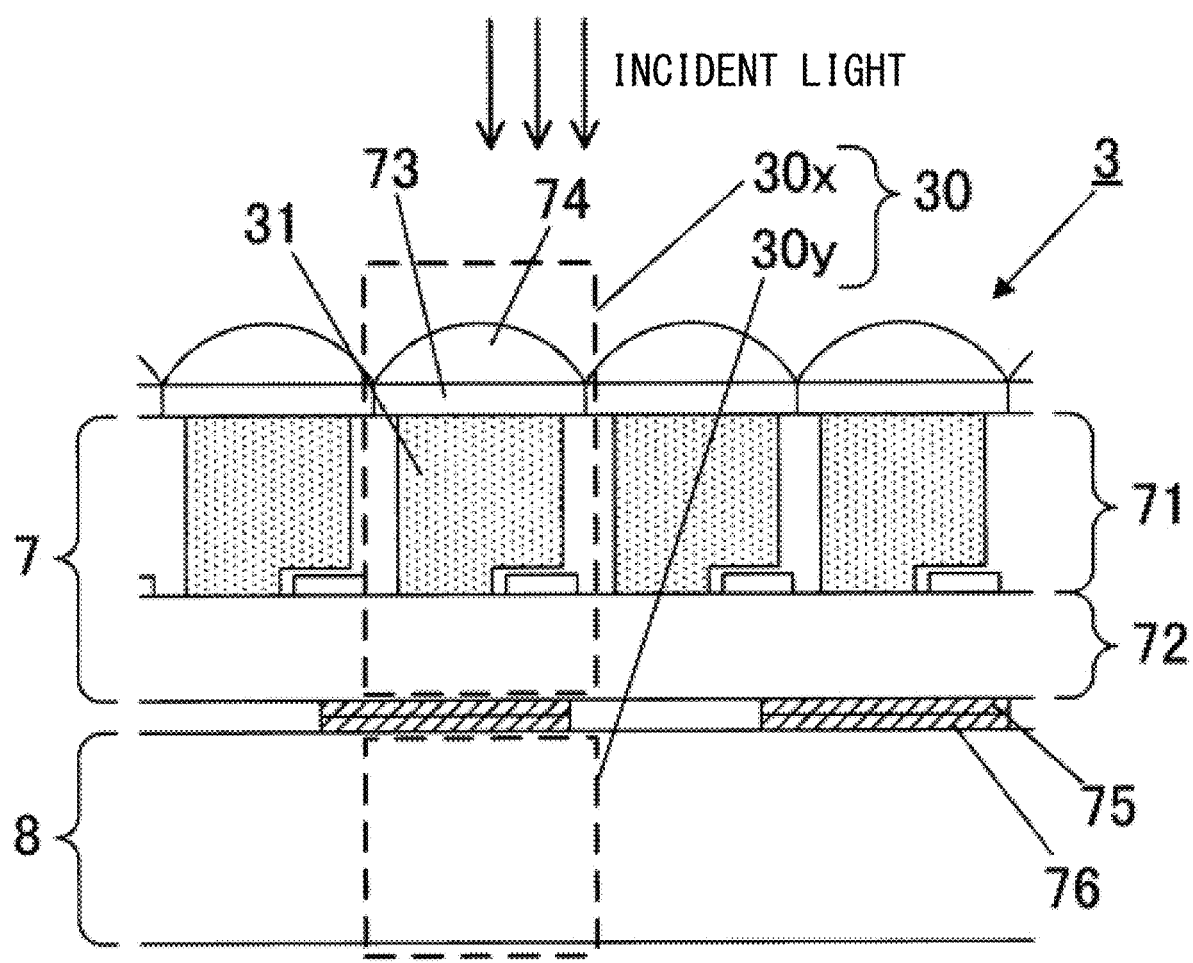
FIG. 4 is a cross-sectional view of the image sensor.

FIG. 4 is a view showing a cross section of the pixel 30 portion of the image sensor 3 of the present embodiment. Note that FIG. 4 shows only a part of the cross section of the entire image sensor 3. The x direction and the z direction shown in FIG. 4 are the same as those in FIG. 1. The image sensor 3 is a so-called back-illuminated image sensor. The image sensor 3 photoelectrically converts light incident from top of the paper surface. The image sensor 3 includes a first semiconductor substrate 7 and a second semiconductor substrate 8.

As described above, the image sensor 3 has a plurality of pixels 30. One pixel 30 includes a pixel upper portion 30x provided in the first semiconductor substrate 7 and a pixel lower portion 30y provided in the second semiconductor substrate 8. One pixel upper portion 30x includes one microlens 74, one color filter 73, one light receiving portion 31 of a photodiode PD, and the like.

The first semiconductor substrate 7 includes a light receiving layer 71 including the light receiving portion 31 of the photodiode PD included in the pixel upper portion 30x, and a wiring layer 72 in which transistors such as a transfer transistor TX and an amplification transistor TA are formed. The light receiving layer 71 is arranged on a side (back surface side) of the first semiconductor substrate 7 opposite to the wiring layer 72. A plurality of light receiving portions 31 are arranged two-dimensionally in the light receiving layer 71.

Since the pixel upper portion 30x includes the light receiving portion 31 which is a portion for photoelectrically converting incident light, the pixel upper portion 30x can be regarded as an image-capturing portion.

A vertical selection transistor TV, a horizontal selection transistor TH2, a special horizontal selection transistor TH1, a vertical selection line VS, a horizontal selection line HS, a special horizontal selection line ZS, a readout unit, a current source CS, and the like, which are included in the pixel lower portion 30y, are arranged in the second semiconductor substrate 8.

A plurality of bumps 75 are arranged on a surface of the wiring layer 72. A plurality of bumps 76 corresponding to the plurality of bumps 75 are arranged on a surface of the second semiconductor substrate 8 facing the wiring layer 72. The plurality of bumps and the plurality of bumps 76 are joined to each other. The first semiconductor substrate 7 and the second semiconductor substrate 8 are electrically connected via the plurality of bumps 75 and the plurality of bumps 76.

Note that the configuration of the circuit elements arranged in the first semiconductor substrate 7 and the second semiconductor substrate 8 described above is only an example, and some of the components may be arranged in the first semiconductor substrate 7 or may be arranged in the second semiconductor substrate 8. For example, a light receiving layer 71 including the light receiving portion 31 of the photodiode PD, the transfer transistor TX, the amplification transistor TA, and the vertical selection transistor TA may be formed in the first semiconductor substrate 7, and the horizontal selection transistor TH2, the special horizontal selection transistor TH1, the horizontal selection line HS, the special horizontal selection line ZS, the readout unit, and the current source CS may be arranged in the second semiconductor substrate 8.

The light receiving layer 71 including the light receiving portion 31 of the photodiode PD, the transfer transistor TX, the amplification transistor TA, and the vertical selection transistor TA, the horizontal selection transistor TH2, the special horizontal selection transistor TH1, the horizontal selection line HS, and the special horizontal selection line ZS may be formed in the first semiconductor substrate 7, and the readout unit and the current source CS may be arranged in the second semiconductor substrate 8.

The vertical control unit VC and the horizontal control unit HC may be arranged in the first semiconductor substrate 7 or may be arranged in the second semiconductor substrate 8.

However, if a large number of circuit elements are arranged in the first semiconductor substrate 7, areas or volumes for arrangement of the light receiving portions 31 in the first semiconductor substrate 7 cannot be sufficiently ensured. Thus, the readout unit ADC and the current source CS are preferably arranged in the second semiconductor substrate 8.

A color filter that matches spectral sensitivity characteristics of each pixel is arranged in the color filter 73 of each pixel 30.

Further, a color filter 73 is also arranged in each special pixel ZZ of the pixels 30. In a case where the special pixels ZZ are AF pixels, G color filters are provided as the color filters 73. Note that the color filters 73 provided in the special pixels ZZ may be filters that transmit the entire wavelength range of incident light. Further, the color filters 73 provided in the special pixels ZZ may be color filters having spectral characteristics different from those of any of the color filters 73 arranged in the image-capturing pixel 30c.

In a case where the special pixels ZZ are pixels for receiving infrared light, the color filters 73 have a high infrared light transmittance and a low visible light transmittance. Further, in a case where the special pixels ZZ are pixels for receiving visible light, the color filters 73 have a high transmittance for the entire wavelength region of the visible light.

Note that the sensitivity of the special pixels ZZ may be different from the sensitivity of the image-capturing pixels 30c by making an average transmittance of the color filters 73 of the special pixels ZZ different from an average transmittance of the color filters 73 of the image-capturing pixels 30c, for example. Here, the average transmittance means an average of transmittances for all wavelengths of light to be photoelectrically converted by the light receiving portion 31.

The sensitivity of the special pixels ZZ may be different from the sensitivity of the image-capturing pixels 30c by making the area of the light receiving portions 31 of the special pixels ZZ different from the area of the light receiving portions 31 of the image receiving pixels 30c, or by varying conditions for ion implantation into the light receiving portions 31.

By making the sensitivity of the special pixels ZZ different from the sensitivity of the image-capturing pixels 30c, the special pixels ZZ and the image-capturing pixels 30c output signals different from each other. By generating image data based on the different signals, the image quality (resolution, gradation, color) of the image can be improved.

Figure 5:
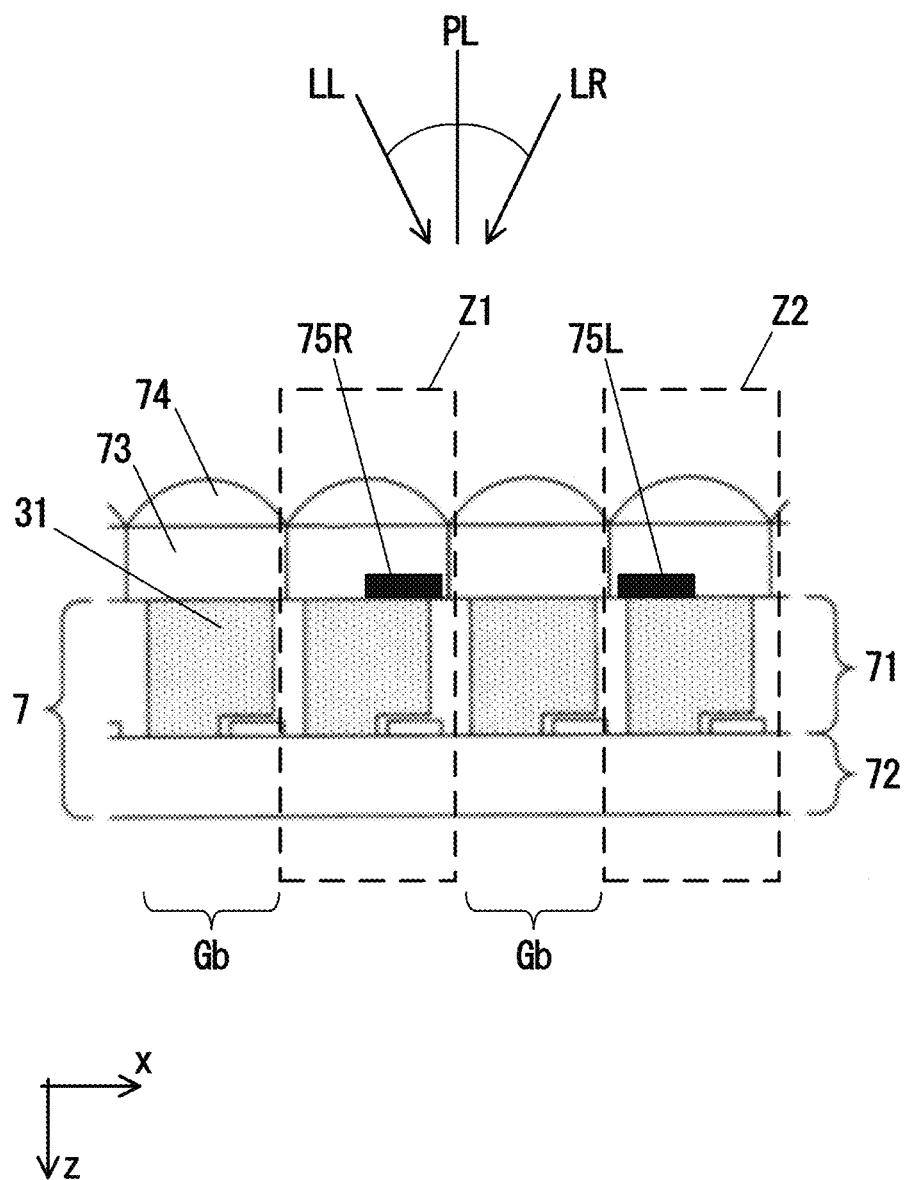
FIG. 5 is a cross-sectional view of image-capturing pixels and focus detection pixels.

FIG. 5 is a view showing an example in a case where the special pixels ZZ are AF pixels. In FIG. 5, the second semiconductor substrate 8 is omitted from the cross-sectional view of the image sensor 3 shown in FIG. 4.

The special pixel Z1 is provided with a light-shielding portion 75R that shields the right side of the light-receiving portion 31 at a boundary between the color filter 73 and the first semiconductor substrate 7. On the other hand, the special pixel Z2 is provided with a light-shielding portion 75L that shields the left side of the light-receiving portion 31 at the boundary.

Among lights incident onto the special pixel Z1, a light LL incident inclined in −x direction with respect to a direction PL perpendicular to an incident surface of the image sensor 3 is shielded by the light-shielding portion 75R. On the other hand, among lights incident onto the special pixel Z2, a light LR incident inclined in +x direction with respect to a direction PL perpendicular to an incident surface of the image sensor 3 is shielded by the light-shielding portion 75L.

As a result, the special pixel Z1 has a lower sensitivity to light incident from one incident direction and the special pixel Z2 has a lower sensitivity to light incident from another incident direction. Conversely, the special pixel Z1 has a higher sensitivity to light incident from one incident direction and the special pixel Z2 has a higher sensitivity to light incident from another incident direction.

When this image sensor 3 is applied to the image-capturing device of FIG. 1, each of the special pixels Z1 and Z2 become elements having high sensitivities to lights passing through different positions in a pupil plane of the image-capturing optical system 2, and thus function as pixels for image plane phase difference focus detection.

Note that positions where the light-shielding portions 75R, 75L are provided are not limited to the boundaries between the color filters 73 and the first semiconductor substrate 7 described above, but may be somewhere between the microlens 74 and the first semiconductor substrate 7.

In the embodiment of the image sensor described above, the arrangement of the pixels 30 is not necessarily limited to the Bayer array. Further, the horizontal selection line HS and the special horizontal selection line ZS may extend in a shorter side direction, instead of a longer side direction of the image sensor 3. The vertical selection line VS may extend in the longer side direction, instead of the shorter side direction of the image sensor 3.

Further, the horizontal selection line HS, the special horizontal selection line ZS, and the vertical selection line VS that control the signal output of each pixel 30 may not extend in the horizontal direction (x direction) and the vertical direction (y direction). The horizontal selection line HS, the special horizontal selection line ZS, and the vertical selection line VS may not be shared by a plurality of pixels 30.

According to the above-described embodiment, the following operational effects can be obtained.

(1) An image sensor 3 of the above embodiment includes: a first photoelectric conversion unit (photodiode PD in a first pixel ZZ) that photoelectrically converts light to generate an electric charge; a first output unit TH1 that outputs a first signal based on the electric charge generated by the first photoelectric conversion unit; a plurality of second photoelectric conversion units (photodiodes PD in image-capturing pixels 30c) that photoelectrically convert light to generate electric charges; a plurality of second output units TH2 that output second signals based on the electric charges generated by the second photoelectric conversion units; an output line RW to which the first output unit TH1 and the plurality of second output units TH2 are connected, and to which at least one of the first signal and the second signals is output; a first control line (special horizontal selection line ZS) for controlling output of the first signal from the first output unit TH1 to the output line RW; and second control lines (horizontal selection lines HS) for controlling outputs of the second signals from the plurality of second output units TH2 to the output line RW. With this configuration, outputs of any one or more pixels 30 can be selected from the plurality of pixels connected to the output line RW, and output to the output line RW.

(2) Further, the first output unit TH1 outputs the first signal at a timing different from those of the outputs of the second signals by the second output units TH2. With this configuration, the first signal based on the first photoelectric conversion unit and the second signals based on the second photoelectric conversion units can be read out in any order.

(3) Further, while the first output unit TH1 outputs the first signal, the second output units TH2 are controlled via the second control lines (horizontal selection lines HS) so as not to output the second signals. With this configuration, it is possible to prevent the second signals based on the second photoelectric conversion units from being mixed into the output of the first signal based on the first photoelectric conversion unit, and to output a more accurate signal.

(4) Further, while the second output units TH2 output the second signals, the first output unit TH1 is controlled via the first control line (special horizontal selection line ZS) so as not to output the first signal. With this configuration, it is possible to prevent the first signal based on the first photoelectric conversion unit from being mixed into the outputs of the second signals based on the second photoelectric conversion units, and to output a more accurate signal.

(5) Further, while the plurality of second output units TH2 simultaneously output the plurality of second signals, the first output unit TH1 is controlled via the first control line (special horizontal selection line ZS) so as not to output the first signal. With this configuration, it is possible to prevent the first signal based on the first photoelectric conversion unit from being mixed into the outputs of the second signals based on the second photoelectric conversion units, and to output a more accurate signal.

(6) Further, the image sensor 3 includes third control lines (vertical selection lines VS) for controlling at least one of the output of the first signal from the first output unit TH1 to the output line RW and the outputs of the second signals from the second output units TH2 to the output line RW, wherein: the first output unit TH1 is controlled via the first control line (special horizontal selection line ZS) and the third control lines (vertical selection lines VS); and the second output units TH2 are controlled via the second control line (horizontal selection line HS) and the third control line (vertical selection line VS). With this configuration, a pixel 30 having its output to be read out from the output line RW can be more flexibly selected.

(7) Further, the first control line (special horizontal selection line ZS) and the second control lines (horizontal selection lines HS) are provided in a first direction, and the third control lines (vertical selection lines VS) are provided in a second direction intersecting the first direction. With this configuration, it is possible to conveniently select a pixel 30 having its output to be read out from the output line RW.

(8) Further, the image sensor 3 includes a light-shielding portion that shields a part of light incident on the first photoelectric conversion unit. With this configuration, a relationship between an incident angle and a sensitivity of light incident onto the first photoelectric conversion unit can be different from a relationship between an incident angle and a sensitivity of light incident onto the second photoelectric conversion unit.

(9) Further, the first output unit TH1 outputs the first signal used for focus detection, and the second output units TH2 output the second signals used for image generation. With this configuration, the first pixel ZZ can be used as a pixel for image plane phase difference focusing detection.

(10) Further, the first photoelectric conversion unit is a photoelectric conversion unit having a sensitivity different from that of the second photoelectric conversion unit. With this configuration, it is possible to provide each of the first pixels ZZ and the second pixels (image-capturing pixels 30c) with an individual optimal sensitivity.

(11) Further, the second photoelectric conversion unit photoelectrically converts light transmitted through a first filter having a first spectral characteristic. With this configuration, it is possible to provide the image sensor 3 with a desired spectral sensitivity.

(12) Further, the first photoelectric conversion unit photoelectrically converts light transmitted through a second filter having a second spectral characteristic different from the first spectral characteristic. With this configuration, it is possible to provide the first pixels (special pixels ZZ) with their optimal spectral sensitivity.

(13) Further, the image sensor 3 includes a control unit (selection transistors TV, TH1, TH2) to which the first control line (special horizontal selection line ZS) and the second control lines (horizontal selection line HS) are connected, wherein the control unit controls the output of the first signal from the first output unit TH1 to the output line RW and the outputs of the second signals from the second output units TH2 to the output line. With this configuration, the control of the output from the first output unit TH1 to the output line RW and the control of the output from the second output unit TH2 to the output line RW can be performed more conveniently.

(14) Further, the control unit (selection transistors TV, TH1, TH2) may be stacked with image-capturing units (pixel upper portions 30x) having the first photoelectric conversion unit and the plurality of second photoelectric conversion units. As a result, it is not necessary to arrange the control unit (selection transistors TV, TH1, TH2) in the first semiconductor substrate 7 in which the image-capturing units (pixel upper portions 30x) are arranged, and sufficient areas and volumes of the light receiving portions 31 in the image-capturing units (pixel upper portions 30x) can be ensured. Thus, the sensitivity of the image sensor 3 can be improved.

(15) Further, the image sensor 3 may include a readout unit ADC that is stacked with the image-capturing units (pixel upper portions 30x) having the first photoelectric conversion unit and the plurality of second photoelectric conversion units, and reads out at least one of the first signal and the second signals from the output line RW. With this configuration, the readout unit ADC is arranged so as to be stacked with the second semiconductor substrate 8 or the like different from the first semiconductor substrate 7 having the image-capturing units (pixel upper portions 30x). Thus, sufficient areas and volumes of the light receiving portions 31 in the image-capturing units (pixel upper portions 30x) can be ensured. Thus, the sensitivity of the image sensor 3 can be improved.

(16) Further, the readout unit ADC may be a conversion unit that converts at least one of the first signal and the second signals from an analog signal into a digital signal. With this configuration, the readout unit ADC generates a digital signal. As a result, it is easy to design a signal processing system downstream of the readout unit ADC.

Figure 6:
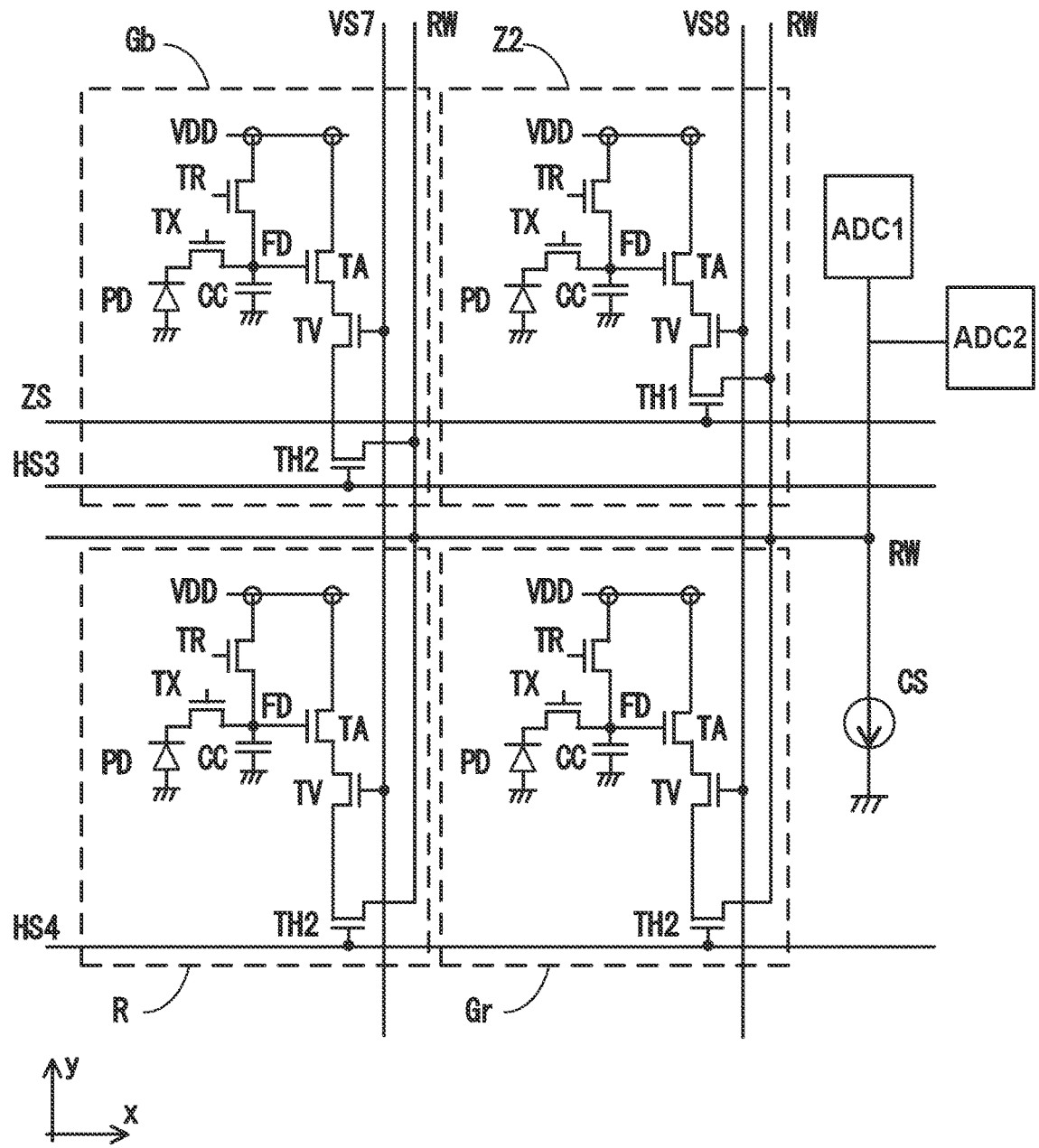
FIG. 6 is another circuit diagram of pixels of an image sensor and a readout circuit.

(17) Further, as shown in FIG. 6, the image sensor 3 may include a first readout unit ADC 1 that reads out the first signal from the output line RW and a second readout unit ADC 2 that reads out the second signal from the output line RW, both of the first readout unit ADC 1 and the second readout unit ADC 2 are stacked with the image-capturing units (upper pixel portions 30x) having the first photoelectric conversion unit and the plurality of second photoelectric conversion units. With this configuration, the first photoelectric conversion unit and the plurality of second photoelectric conversion units can be read out by individual readout units, so that an optimal readout can be performed for each pixel.

(18) Further, the first readout unit ADC 1 may be a first conversion unit that converts the first signal from an analog signal into a digital signal, and the second readout unit ADC 2 may be a second conversion unit that converts the second signal from an analog signal into a digital signal. With this configuration, outputs of the first photoelectric conversion unit and the plurality of second photoelectric conversion units can be converted by individual analog/digital converters, so that an optimal readout can be performed for each pixel.

(19) Further, the first output unit TH1 and the second output unit TH2 may be selection transistors, and the first control line (special horizontal selection line ZS) and the second control line (horizontal selection line HS) may be control lines for controlling the selection transistors. With this configuration, the first output unit TH1 and the second output unit TH2 can be formed with a simple configuration.

(20) An image-capturing device of the embodiment includes the image sensor 3 having any one of the above configurations (1) to (19), and a generation control unit 4, which may also be regarded as a generation unit, that generates image data based on the second signal. With this configuration, outputs of any one or more pixels 30 can be selected among the pixels 30 connected to the output line RW of the image sensor 3 and output to the output line RW for readout.

Although various embodiments and modifications have been described above, the present invention is not limited thereto. Further, each embodiment and modification may be applied alone or may be used in combination. Other aspects conceivable within the scope of the technical idea of the present invention are also included within the scope of the present invention.

The disclosure of the following priority application is herein incorporated by reference:

Japanese patent application No. 2018-99061 (filed May 23, 2018)

REFERENCE SIGNS LIST

1: image-capturing device, 2: image-capturing lens, 3: image sensor, 4: control unit, 5: lens drive unit, 7: first semiconductor substrate, 8: second semiconductor substrate, BC, BC1, BC2: pixel block, HC: horizontal control unit, VC: vertical control unit, pixel 30, Gr, Gb: G pixel, R: R pixel, B: B pixel, Z1, Z2: special pixel, VS, VS1 to HS8: vertical selection line, HS, HS1 to HS4: horizontal selection line, ZS: special horizontal selection line, PD: photodiode, TX: transfer transistor, TR: reset transistor, TA: amplification transistor, TV: vertical selection transistor, TH1: special horizontal selection transistor, TH2: horizontal selection transistor, RW: readout line, ADC: readout unit, 31: photosensitive unit, 73: color filter

The invention claimed is:

1. An image sensor, comprising:
a first photoelectric converter that photoelectrically converts light to generate an electric charge;
a first output unit that outputs a first signal based on the electric charge generated by the first photoelectric converter;
a plurality of second photoelectric converters that photoelectrically convert light to generate electric charges;
a plurality of second output units that output second signals based on the electric charges generated by the plurality of second photoelectric converters;
an output line to which the first output unit and the plurality of second output units are connected, and to which at least one of the first signal and the second signals is output;
a first control line for controlling output of the first signal from the first output unit to the output line;
second control lines for controlling outputs of the second signals from the plurality of second output units to the output line; and
third control lines for controlling at least one of the output of the first signal from the first output unit to the output line and the outputs of the second signals from the plurality of second output units to the output line, wherein:
the first output unit is controlled via the first control line and the third control lines; and
the plurality of second output units are controlled via the second control lines and the third control lines.

2. The image sensor according to claim 1, wherein:
the first output unit outputs the first signal at a timing different from the timings at which the plurality of second output units output the second signals.

3. The image sensor according to claim 1, wherein:
while the first output unit outputs the first signal, the plurality of second output units are controlled via the second control lines so as not to output the second signals.

4. The image sensor according to claim 1, wherein:
while the plurality of second output units output the second signals, the first output unit is controlled via the first control line so as not to output the first signal.

5. The image sensor according to claim 1, wherein:
while the plurality of second output units simultaneously output the second signals, the first output unit is controlled via the first control line so as not to output the first signal.

6. The image sensor according to claim 1, wherein:
the first control line and the second control lines are provided in a first direction, and
the third control lines are provided in a second direction intersecting the first direction.

7. The image sensor according to claim 1, comprising:
a light-shielding portion that shields a part of the light incident on the first photoelectric converter.

8. The image sensor according to claim 1, wherein:
the first signal is used for focus detection, and
the second signals are used for image generation.

9. The image sensor according to claim 1, wherein:
the first photoelectric converter has a sensitivity different from a sensitivity of each of the plurality of second photoelectric converters.

10. The image sensor according to claim 1, wherein:
each of the plurality of second photoelectric converters photoelectrically converts light transmitted through a first filter having a first spectral characteristic.

11. The image sensor according to claim 10, wherein:
the first photoelectric converter photoelectrically converts light transmitted through a second filter having a second spectral characteristic different from the first spectral characteristic.

12. The image sensor according to claim 1, comprising:
a controller to which the first control line and the second control lines are connected,
wherein the controller controls the output of the first signal from the first output unit to the output line and controls the outputs of the second signals from the plurality of second output units to the output line.

13. The image sensor according to claim 12, wherein:
the controller is stacked with image-capturing units having the first photoelectric converter and the plurality of second photoelectric converters.

14. The image sensor according to claim 1, comprising
a readout unit that is stacked with image-capturing units having the first photoelectric converter and the plurality of second photoelectric converters and that reads out at least one of the first signal and the second signals from the output line.

15. The image sensor according to claim 14, wherein:
the readout unit is an analog/digital converter that converts at least one of the first signal and the second signals from an analog signal into a digital signal.

16. The image sensor according to claim 1, comprising:
a first readout unit that reads out the first signal from the output line; and
a second readout unit that reads out the second signals from the output line, wherein
the first readout unit and the second readout unit are stacked with image-capturing units having the first photoelectric converter and the plurality of second photoelectric converters.

17. The image sensor according to claim 16, wherein:
the first readout unit is a first analog/digital converter that converts the first signal from an analog signal into a digital signal, and the second readout unit is a second analog/digital converter that converts at least one of the second signals from an analog signal into a digital signal.

18. The image sensor according to claim 1, wherein:
the first output unit and the plurality of second output units are selection transistors, and
the first control line and the second control lines are control lines for controlling the selection transistors.

19. An image-capturing device, comprising:
the image sensor according to claim 1; and
a generator that generates image data based on the second signals.

* * * * *